(12) United States Patent
Xie et al.

(10) Patent No.: US 12,424,591 B2
(45) Date of Patent: Sep. 23, 2025

(54) METHOD AND STRUCTURE OF FORMING INDEPENDENT CONTACT FOR STAGGERED CFET

(71) Applicant: INTERNATIONAL BUSINESS MACHINES CORPORATION, Armonk, NY (US)

(72) Inventors: Ruilong Xie, Niskayuna, NY (US); Albert M. Chu, Nashua, NH (US); Albert M. Young, Fishkill, NY (US); Brent A. Anderson, Jericho, VT (US); Junli Wang, Slingerlands, NY (US); Ravikumar Ramachandran, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 582 days.

(21) Appl. No.: 17/807,765

(22) Filed: Jun. 20, 2022

(65) Prior Publication Data
US 2023/0411358 A1 Dec. 21, 2023

(51) Int. Cl.
*H01L 25/07* (2006.01)
*H01L 21/02* (2006.01)
(Continued)

(52) U.S. Cl.
CPC ...... *H01L 25/071* (2013.01); *H01L 21/02507* (2013.01); *H01L 21/02603* (2013.01);
(Continued)

(58) Field of Classification Search
CPC ............. H01L 25/071; H01L 21/02507; H01L 21/02603; H10D 62/121; H10D 64/017; H10D 84/0158; H10D 84/038; H10D 88/01; H10D 30/43; H10D 30/014; H10D 30/6735; H10D 30/6757; H10D 64/256; H10D 84/0135; H10D 84/0149; H10D 84/0151; H10D 84/83; H10D 88/00; H10D 84/0128; B82Y 10/00
See application file for complete search history.

(56) References Cited

U.S. PATENT DOCUMENTS 9,659,963 B2 5/2017 Cheng
9,837,414 B1 12/2017 Balakrishnan
(Continued)

OTHER PUBLICATIONS

Ryckaert et al., "The Complementary FET (CFET) for CMOS scaling beyond N3", 2018 Symposium on VLSI Technology Digest of Technical Papers, © 2018 IEEE, pp. 141-142.

*Primary Examiner* — Karen Kusumakar
(74) *Attorney, Agent, or Firm* — Samuel A. Waldbaum

(57) ABSTRACT

A microelectronic structure including a plurality of lower transistors and a plurality of upper transistor, where each of the plurality of lower transistors and the plurality of upper transistors includes a plurality of channel. Where an upper center vertical axis of each of the plurality of upper transistors is staggered from a lower center vertical axis of each of the lower transistors. A lower gate cut is located between each of the plurality of lower transistors. A first upper gate cut located adjacent to a first upper transistor of the plurality of upper transistors, where the first upper gate cut is in direct contact with a plurality of first channels of the first upper transistor.

20 Claims, 11 Drawing Sheets

(51) Int. Cl.
    *H10D 62/10*     (2025.01)
    *H10D 64/01*     (2025.01)
    *H10D 84/01*     (2025.01)
    *H10D 84/03*     (2025.01)
    *H10D 88/00*     (2025.01)

(52) U.S. Cl.
    CPC ......... *H10D 62/121* (2025.01); *H10D 64/017* (2025.01); *H10D 84/0158* (2025.01); *H10D 84/038* (2025.01); *H10D 88/01* (2025.01)

(56) References Cited

U.S. PATENT DOCUMENTS

| | | |
|---|---|---|
| 10,192,819 B1 | 1/2019 | Chanemougame |
| 10,192,867 B1 | 1/2019 | Frougier |
| 10,510,620 B1 | 12/2019 | Chanemougame |
| 10,510,622 B1 | 12/2019 | Frougier |
| 10,685,887 B2 | 6/2020 | Smith |
| 11,177,258 B2 | 11/2021 | Ruilong |
| 2020/0075574 A1 | 3/2020 | Smith |
| 2021/0202500 A1 | 7/2021 | Chanemougame |
| 2021/0217654 A1 | 7/2021 | Xie |
| 2022/0181441 A1* | 6/2022 | Liebmann ............ H10D 84/038 |

* cited by examiner

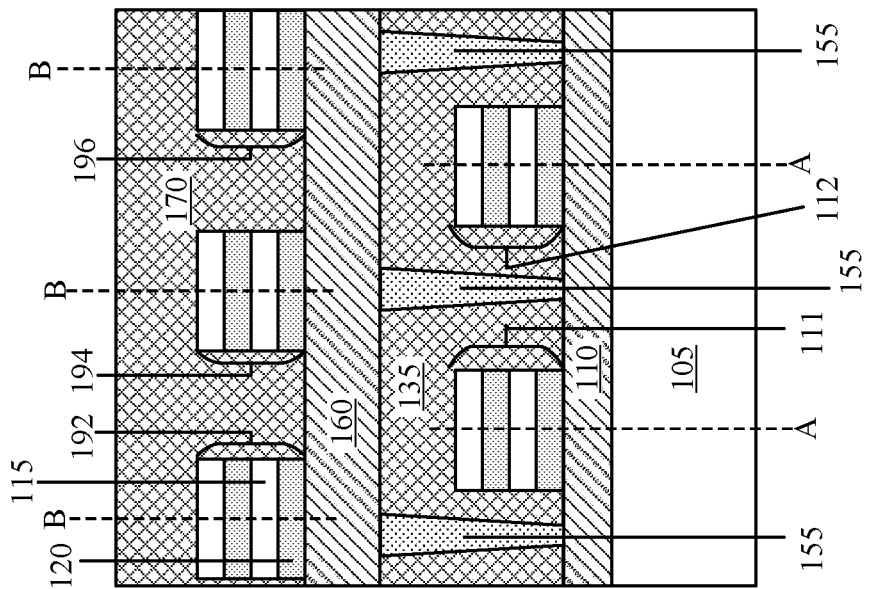
FIG. 8
FIG. 9
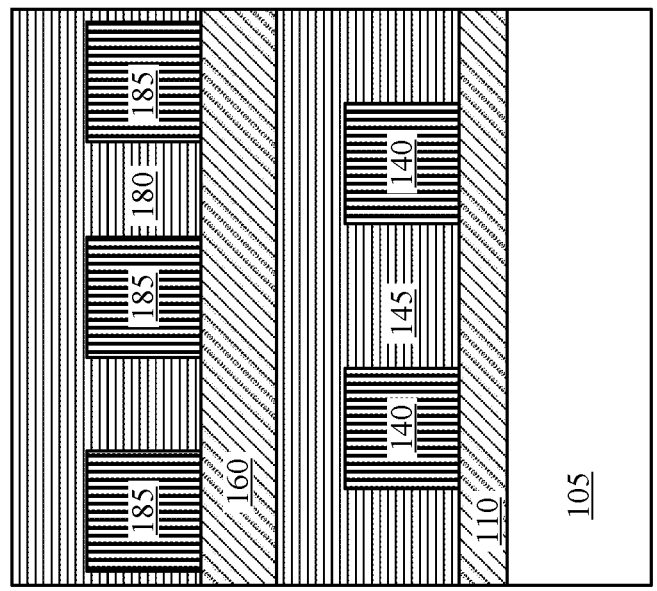
FIG. 10
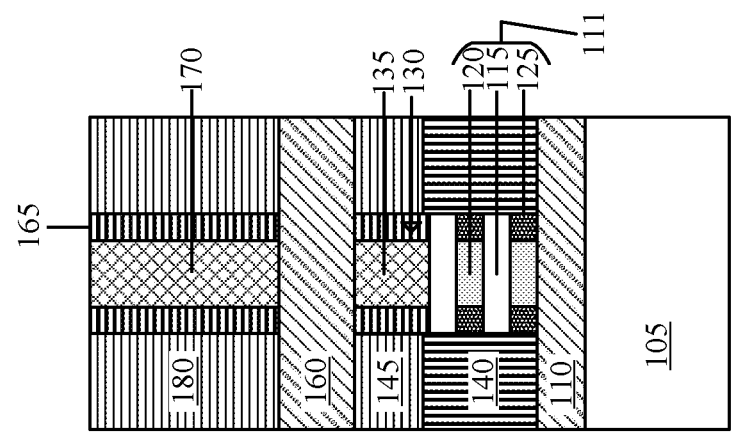

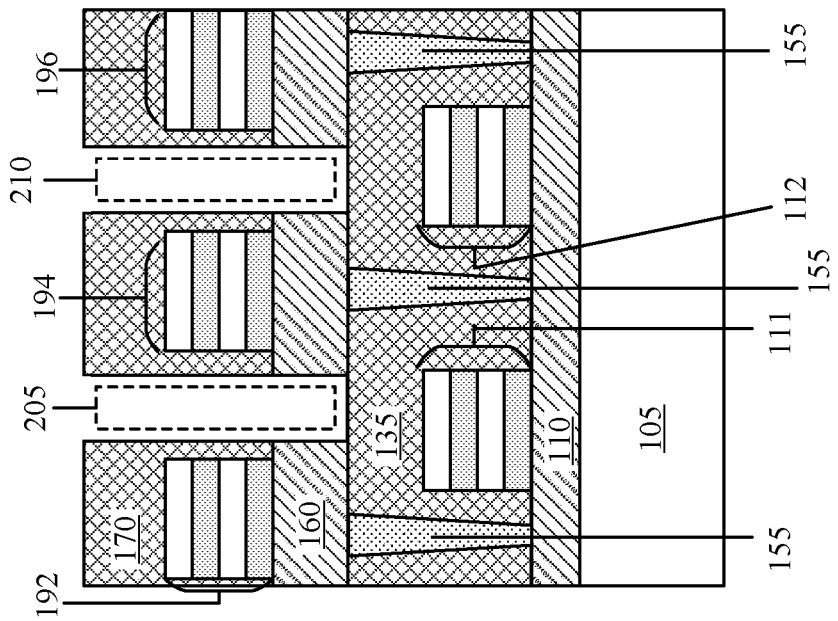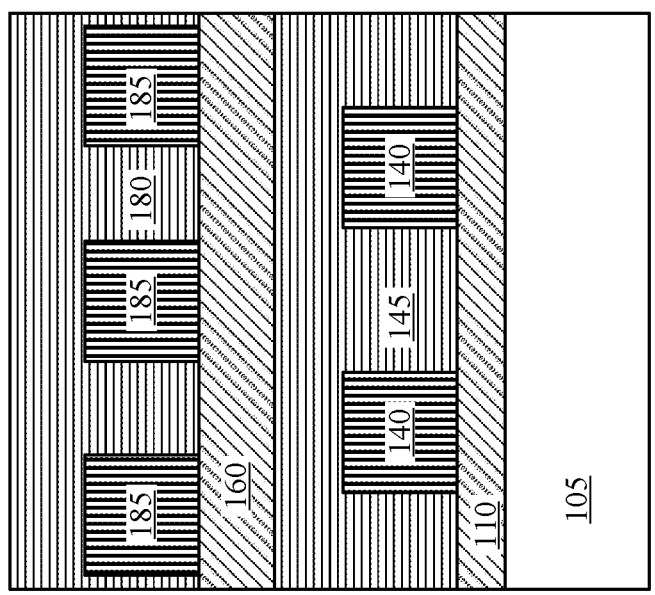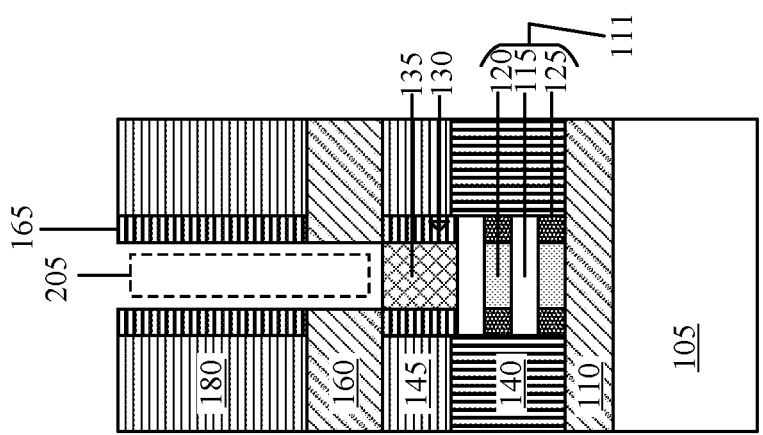

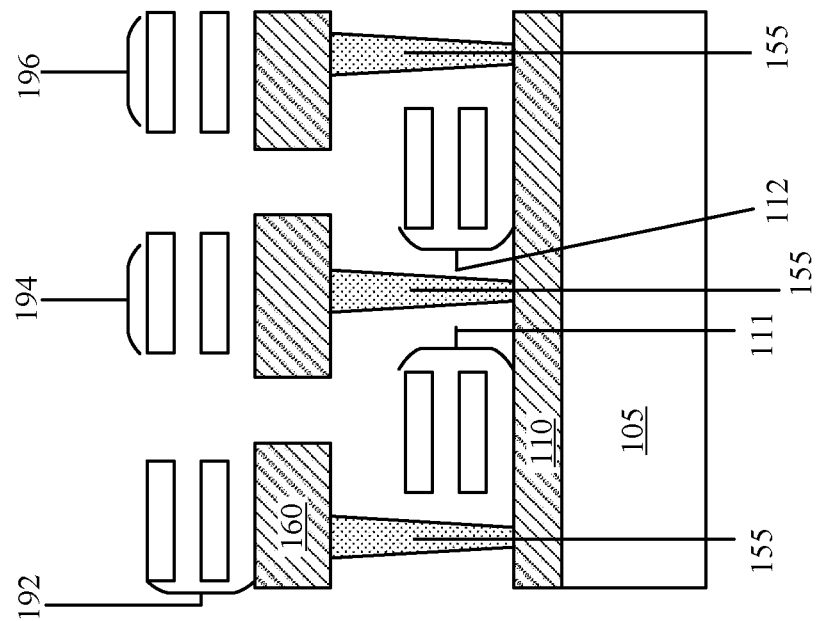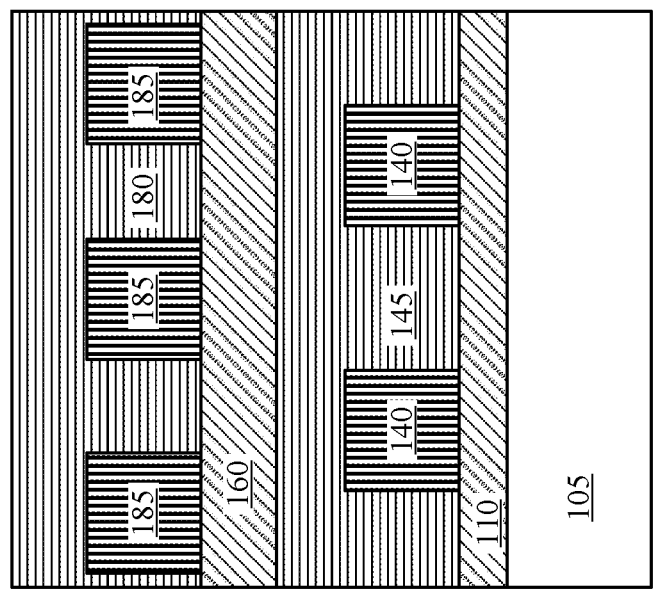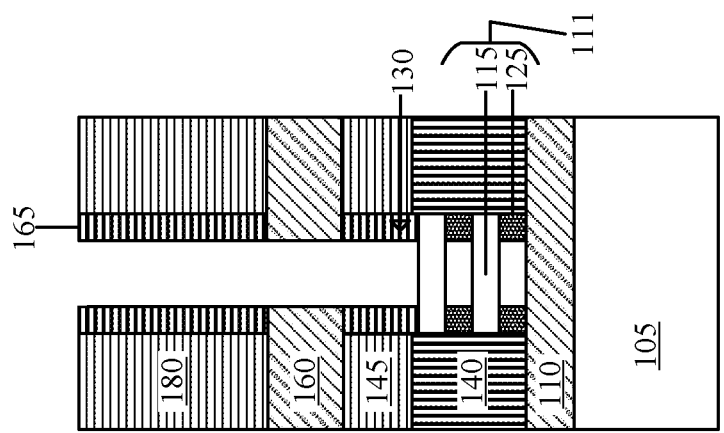
FIG. 14
FIG. 15
FIG. 16

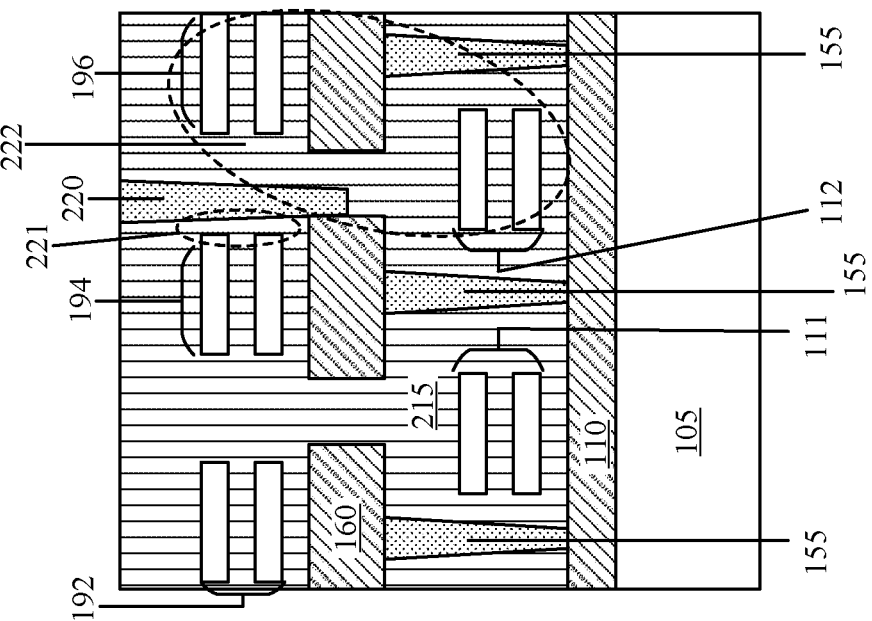
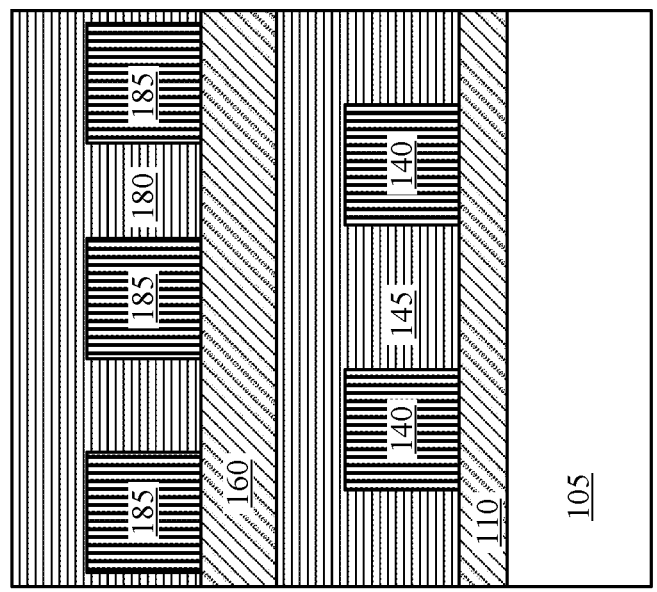
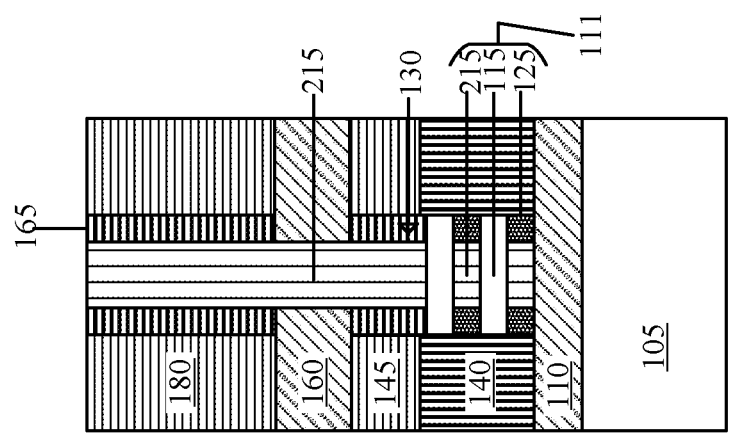

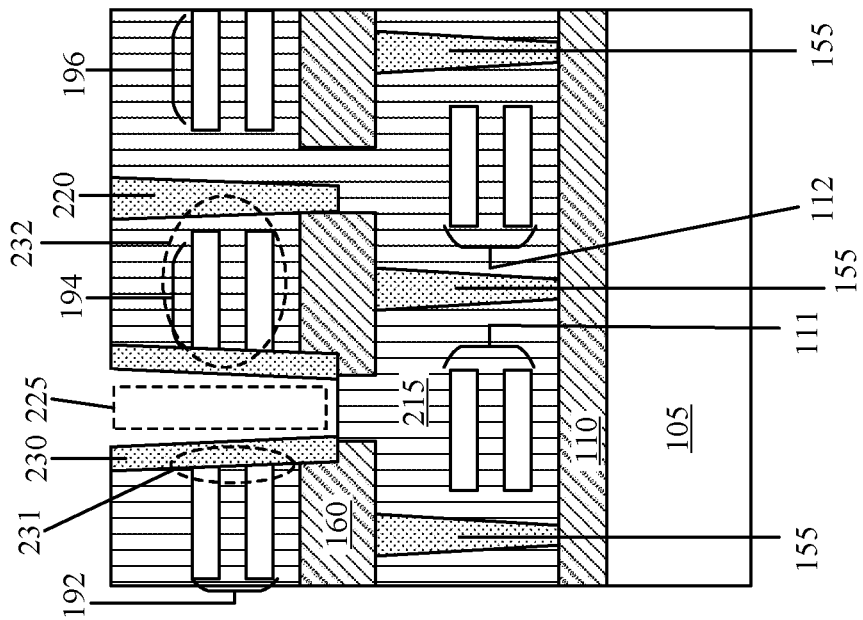
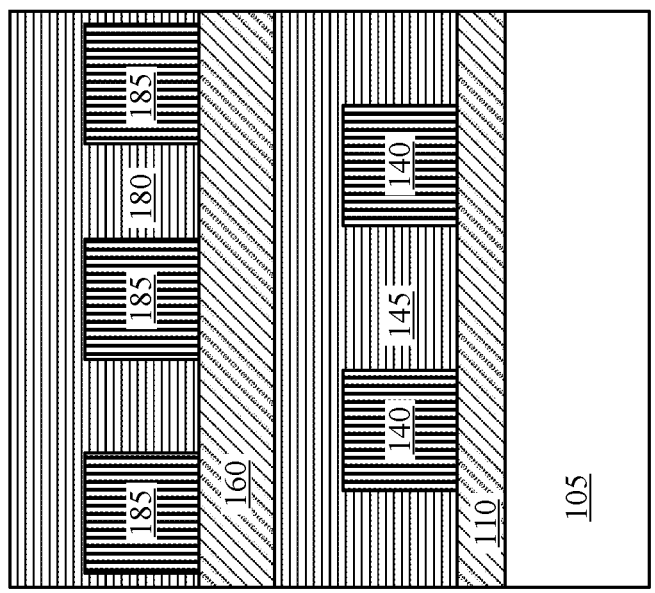
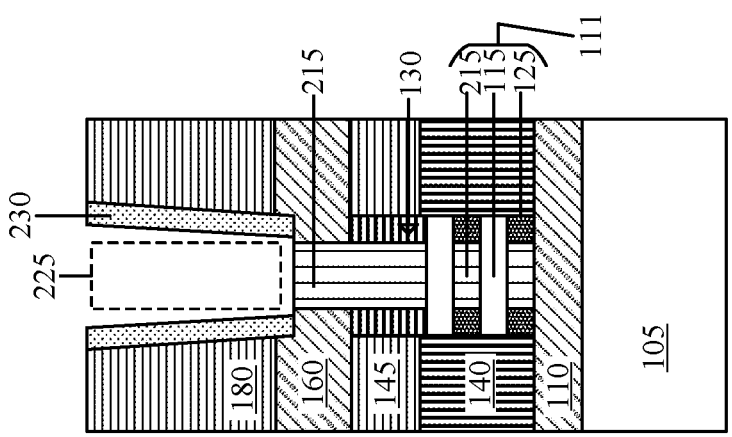

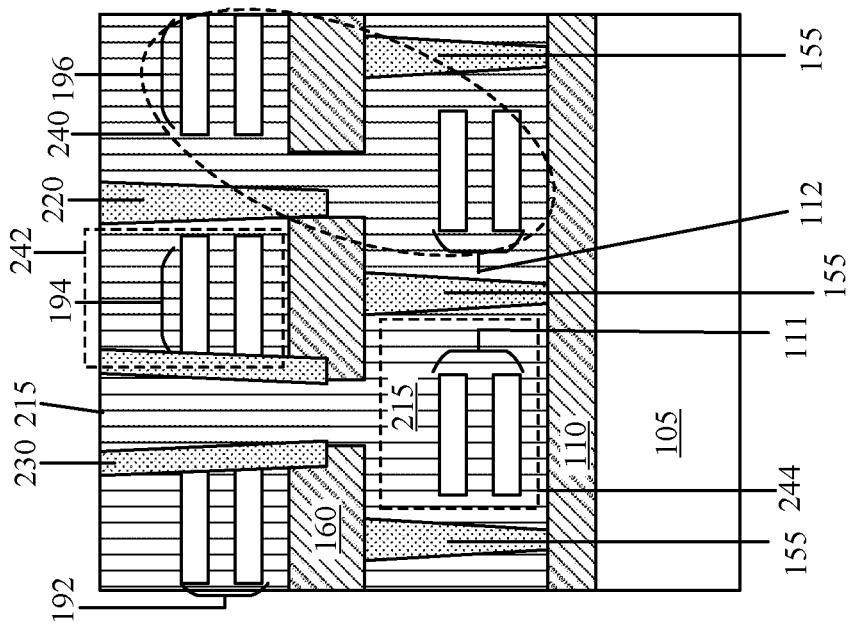
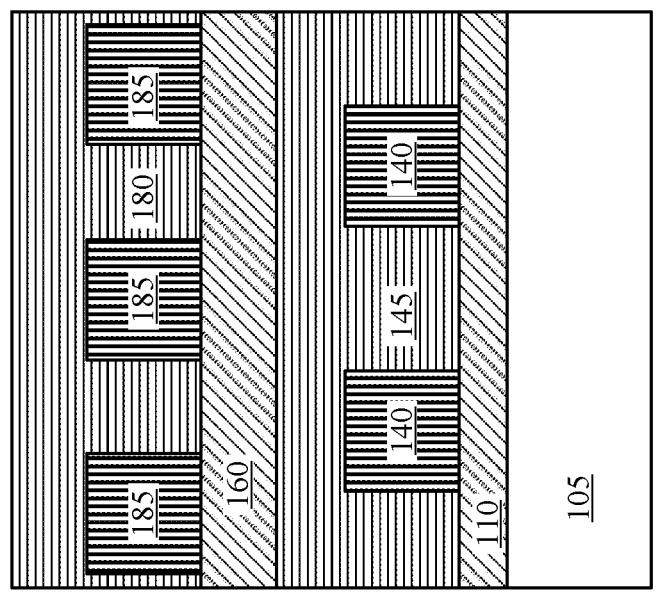
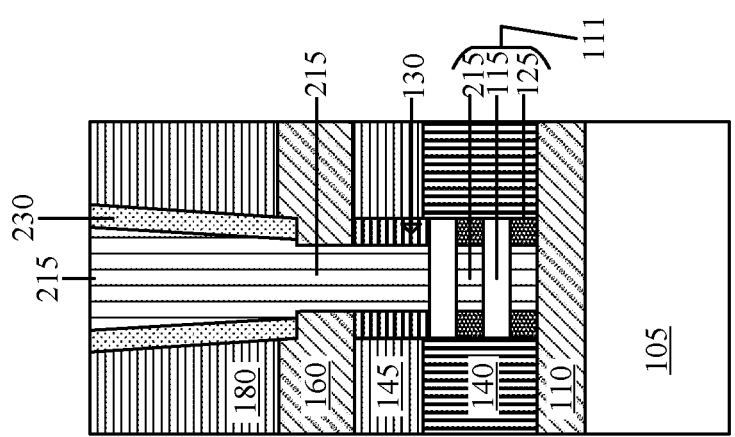

METHOD AND STRUCTURE OF FORMING INDEPENDENT CONTACT FOR STAGGERED CFET

BACKGROUND

The present invention generally relates to the field of microelectronic, and more particularly to formation of an interconnected located in a gate cut, where the interconnected connects at least two components on different devices.

Nanosheet is the lead device architecture in continuing CMOS scaling. However, nanosheet technology has shown issues when scaling down such that as the devices become smaller and closer together, they are interfering with each other. A way to increase the device density is by stacking the devices. However, stacking the devices makes it difficult to form connections to the bottom device and to form shared gate devices.

BRIEF SUMMARY

Additional aspects and/or advantages will be set forth in part in the description which follows and, in part, will be apparent from the description, or may be learned by practice of the invention.

A microelectronic structure including a plurality of lower transistors and a plurality of upper transistor, where each of the plurality of lower transistors and the plurality of upper transistors includes a plurality of channel. Where an upper center vertical axis of each of the plurality of upper transistors is staggered from a lower center vertical axis of each of the lower transistors. A lower gate cut is located between each of the plurality of lower transistors. A first upper gate cut located adjacent to a first upper transistor of the plurality of upper transistors, where the first upper gate cut is in direct contact with a plurality of first channels of the first upper transistor.

A microelectronic structure including a plurality of lower transistors and a plurality of upper transistor, where each of the plurality of lower transistors and the plurality of upper transistors includes a plurality of channels. Where an upper center vertical axis of each of the plurality of upper transistors is staggered from a lower center vertical axis of each of the lower transistors. A lower gate cut is located between each of the plurality of lower transistors. A first upper gate cut located adjacent to a first side of a first upper transistor of the plurality of upper transistors, where the first upper gate cut is in direct contact with a plurality of first channels of the first upper transistor. A second upper gate cut located adjacent a second side of the first upper transistor, where the second upper gate cut is spaced a distance from the plurality of first channels of the first upper transistor.

A microelectronic structure including a plurality of lower transistors and a plurality of upper transistor. Each of the plurality of lower transistors and the plurality of upper transistors includes a plurality of channels, where an upper center vertical axis of each of the plurality of upper transistors is staggered from a lower center vertical axis of each of the lower transistors. A lower gate cut is located between each of the plurality of lower transistors. A first upper gate cut located adjacent to a first side of a first upper transistor of the plurality of upper transistors, where the first upper gate cut is spaced a distance from the plurality of first channels of the first upper transistor. A gate surrounds the plurality of channels of a second upper transistor of the plurality of upper transistors, where the second upper transistor is adjacent to the first upper transistor, wherein the gate surrounds the plurality of channels of a first lower transistor of the plurality of lower transistors, where the gate is continuous between the second upper transistor and the first lower transistor.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 8 illustrates a cross section X of the bottom nano stack of the offset stacked device after the formation of a bonding oxide layer, a top spacer, a top dummy gate, and a top interlayer dielectric, in accordance with the embodiment of the present invention.

FIG. 9 illustrates a cross section $Y_2$ of the source/drain region of the offset stacked device after the formation of a bonding oxide layer, and a plurality of upper source/drains, in accordance with the embodiment of the present invention.

FIG. 10 illustrates a cross section $Y_1$ of the gate region of the offset stacked device after the formation of a bonding oxide layer, a plurality of upper source/drains, and a plurality of upper devices, in accordance with the embodiment of the present invention.

FIG. 11 illustrates a cross section X of the bottom nano stack of the offset stacked device after the formation of a first trench, in accordance with the embodiment of the present invention.

FIG. 12 illustrates a cross section $Y_2$ of the source/drain region of the offset stacked device after the formation of a first trench, in accordance with the embodiment of the present invention.

FIG. 13 illustrates a cross section $Y_1$ of the gate region of the offset stacked device after the formation of a first trench and a second trench, in accordance with the embodiment of the present invention.

FIG. 14 illustrates a cross section X of the bottom nano stack of the offset stacked device after the removal of the dummy gate and the sacrificial layers, in accordance with the embodiment of the present invention.

FIG. 15 illustrates a cross section $Y_2$ of the source/drain region of the offset stacked device after the removal of the dummy gate and the sacrificial layers, in accordance with the embodiment of the present invention.

FIG. 16 illustrates a cross section $Y_1$ of the gate region of the offset stacked device after the removal of the top dummy gate, the dummy gate, and the sacrificial layers, in accordance with the embodiment of the present invention.

FIG. 20 illustrates a cross section X of the bottom nano stack of the offset stacked device after the formation of a shared upper gate cut, in accordance with the embodiment of the present invention.

FIG. 21 illustrates a cross section $Y_2$ of the source/drain region of the offset stacked device after formation of a shared upper gate cut, in accordance with the embodiment of the present invention.

FIG. 22 illustrates a cross section $Y_1$ of the gate region of the offset stacked device after formation of a shared upper gate cut, in accordance with the embodiment of the present invention.

FIG. 23 illustrates a cross section X of the bottom nano stack of the offset stacked device after the formation of an independent gate trench and an isolation liner, in accordance with the embodiment of the present invention.

FIG. 24 illustrates a cross section $Y_2$ of the source/drain region of the offset stacked device after formation of an independent gate trench and an isolation liner, in accordance with the embodiment of the present invention.

FIG. 25 illustrates a cross section $Y_1$ of the gate region of the offset stacked device after formation of an independent gate trench and an isolation liner, in accordance with the embodiment of the present invention.

FIG. 26 illustrates a cross section X of the bottom nano stack of the offset stacked device after the filling of the independent gate trench with additional gate material, in accordance with the embodiment of the present invention.

FIG. 27 illustrates a cross section $Y_2$ of the source/drain region of the offset stacked device after the filling of the independent gate trench with additional gate material, in accordance with the embodiment of the present invention.

FIG. 28 illustrates a cross section $Y_1$ of the gate region of the offset stacked device after the filling of the independent gate trench with additional gate material, in accordance with the embodiment of the present invention.

DETAILED DESCRIPTION

Figure 1:
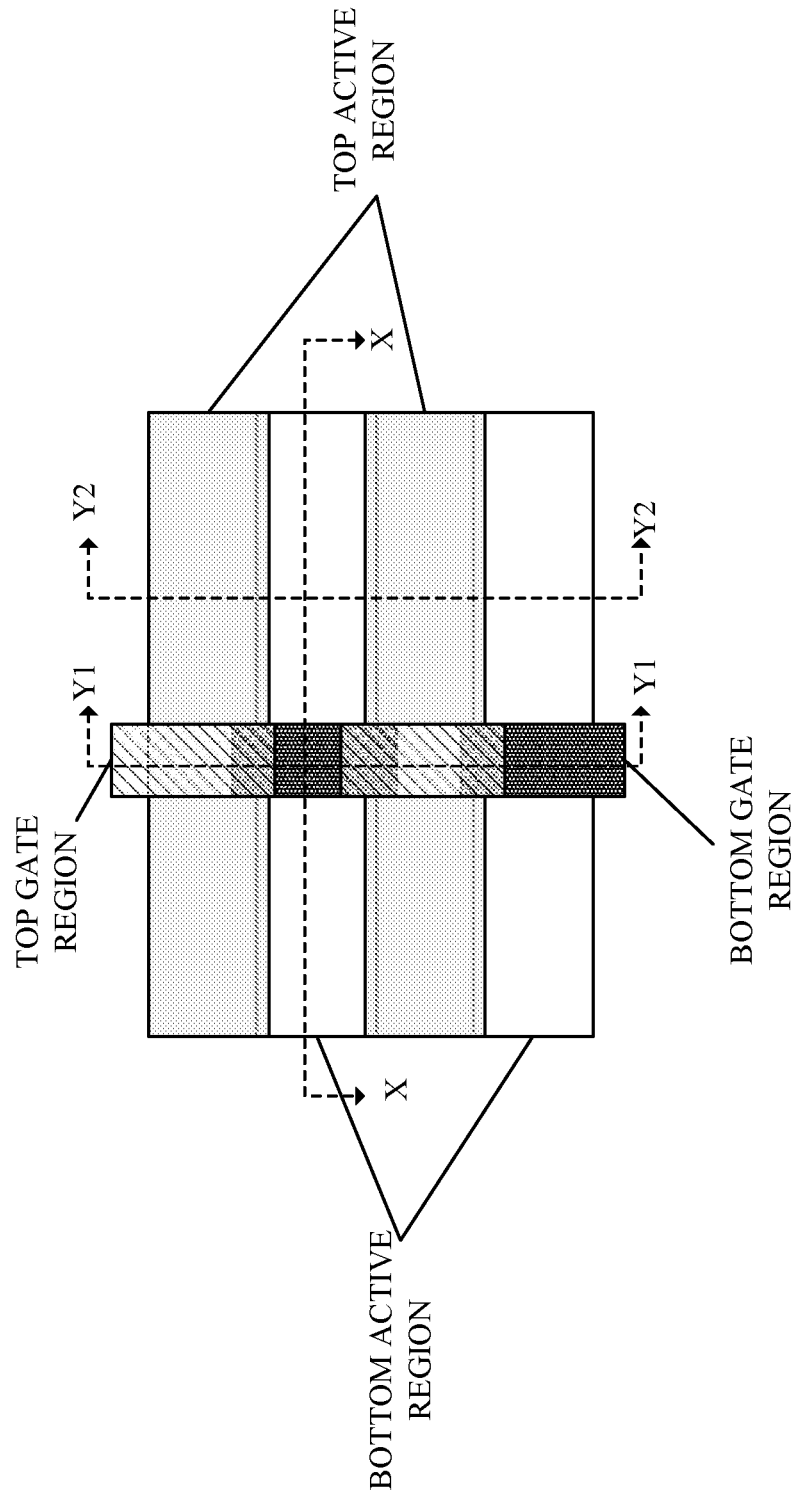
FIG. 1 illustrates a top-down view of offset stack devices, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. The present invention is directed towards stacked FET or stacked transistors, where the upper device (upper transistor) and lower device (lower transistor) are not vertically aligned. The upper device is offset from the lower device, such that the vertical center of the upper device is not located above the center of the lower device. The present invention is directed towards creating a shared gate between the lower device and the offset upper device. Furthermore, the present invention is directed towards creating an independent gate upper device and an independent gate lower device along with the shared gate device.

FIG. 1 illustrates a top-down view of offset stack devices, in accordance with the embodiment of the present invention. The present invention is comprised of one or more offset stacked devices, having a plurality of bottom nano stacks and a plurality of offset upper nano stacks. The offset stacked devices or stacked transistors are separated from adjacent stack nano stacks by a gate cut filled with a dielectric material. Cross section X extends horizontally through one of the bottom nano stacks of the offset stacked devices. Cross section $Y_1$ is perpendicular to cross section X, where cross section $Y_1$ is through the gate region of the offset stacked devices. Cross section $Y_2$ is perpendicular to cross section X, where cross section $Y_2$ is through the source/drain region of the offset stacked devices.

Figure 4:
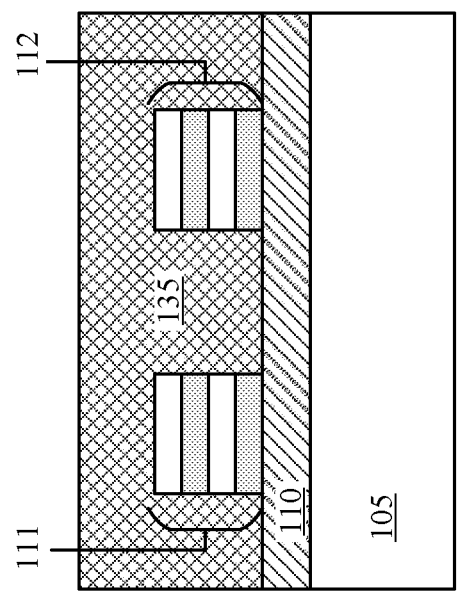
FIG. 4 illustrates a cross section $Y_1$ of the gate region of the offset stacked device, in accordance with the embodiment of the present invention.
Figure 3:
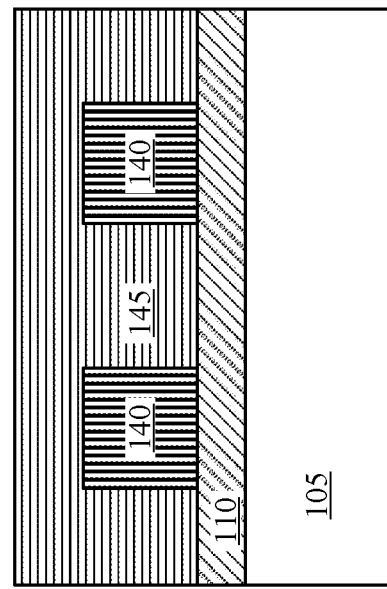
FIG. 3 illustrates a cross section $Y_2$ of the source/drain region of the offset stacked device, in accordance with the embodiment of the present invention.
Figure 2:
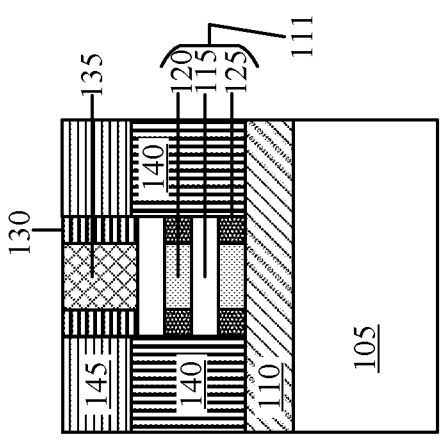
FIG. 2 illustrates a cross section X of the bottom nano stack of offset stacked device, in accordance with the embodiment of the present invention.

FIGS. 2, 3, 4 illustrate the process stage after fabrication of dummy gate, spacer, S/D and ILD for the bottom device. FIG. 2 illustrates a cross section X of the bottom nano stack of the offset stacked device, in accordance with the embodiment of the present invention. The offset stacked device includes a substrate 105, an oxide layer 110, a first bottom nano stack 111, a bottom source/drain 140, an upper spacer 130, a dummy gate 135, and an interlayer dielectric layer 145. The substrate 105 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the substrate 105. In some embodiments, the substrate 105 includes both semiconductor materials and dielectric materials. The semiconductor substrate 105 may also comprise an organic semiconductor or a layered semiconductor such as, for example, Si/SiGe, a silicon-on-insulator or a SiGe-on-insulator. A portion or the entire semiconductor substrate 105 may also be comprised of an amorphous, polycrystalline, or monocrystalline. The semiconductor substrate 105 may be doped, undoped or contain doped regions and undoped regions therein.

The first bottom nano stack 111 includes a plurality of sacrificial layers 120, a plurality of channel layers 115 (i.e., nanosheets), and an inner spacer 125. The plurality of sacrificial layers 120 can be comprised of SiGe, where Ge is in the range of about 15% to 35%. The inner spacer 125 is located adjacent to the sacrificial layers 120. One of the channel layers 115 is located above each of the sacrificial layers 120 and the inner spacer 125. A dummy gate 135 and the upper spacer 130 are located on top of the channel layer 115. The dummy gate 135 is located between sections of the upper spacer 130. A plurality of bottom source/drains 140 are located on the oxide layer 110, where the bottom source/drains 140 are located adjacent to the first bottom nano stack 111. An interlayer dielectric layer 145 is located on top of the bottom source/drain 140 and the interlayer dielectric layer 145 is located adjacent to the upper spacer 130.

The bottom source/drain 140 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

FIG. 3 illustrates a cross section $Y_2$ of the source/drain region of the offset stacked device, in accordance with the embodiment of the present invention. The source/drain region as illustrated by FIG. 3, includes the substrate 105, the oxide layer 110, a plurality of bottom source/drains 140 and the interlayer dielectric layer 145. The interlayer dielectric layer 145 is in contact with multiple sides of each of the plurality of bottom source/drains 140. Each of the plurality of bottom source/drains 140 is located adjacent to a first and second bottom nano stack 111, 112, respectively.

FIG. 4 illustrates a cross section $Y_1$ of the gate region of the offset stacked device, in accordance with the embodiment of the present invention. The offset stacked device includes a plurality of bottom nano stacks 111 and 112 located on top of the oxide layer 110 and the substrate 105. The dummy gate 135 is in contact with multiple sides of each of the plurality of bottom nano stacks 111, 112 and the dummy gate 135 is located on top of the oxide layer 110.

Figure 7:
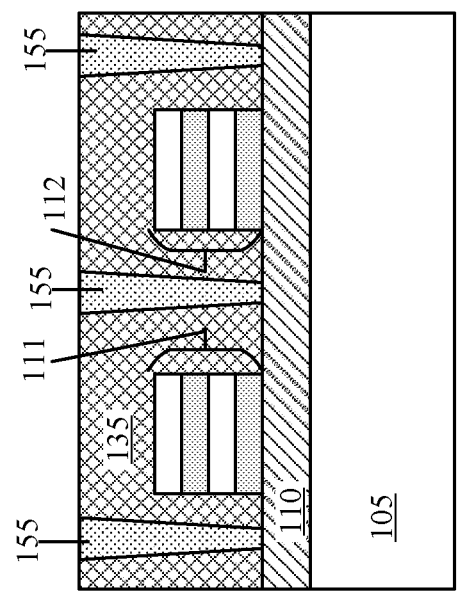
FIG. 7 illustrates a cross section $Y_1$ of the gate region of the offset stacked device after the formation of a plurality of bottom gate cuts, in accordance with the embodiment of the present invention.
Figure 6:
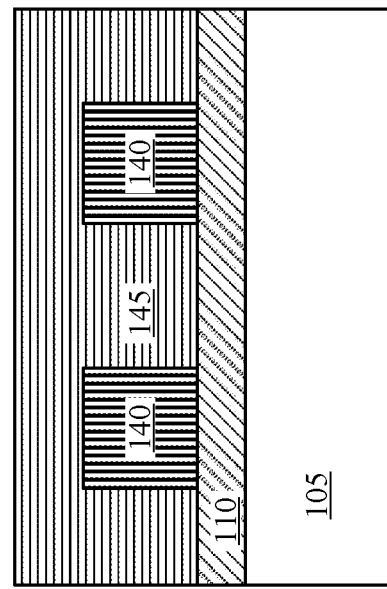
FIG. 6 illustrates a cross section $Y_2$ of the source/drain region of the offset stacked device, in accordance with the embodiment of the present invention.
Figure 5:
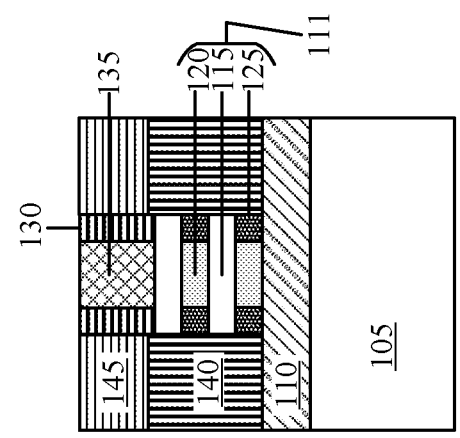
FIG. 5 illustrates a cross section X of the bottom nano stack of the offset stacked device, in accordance with the embodiment of the present invention.

FIGS. 5, 6, and 7 illustrate the process stage after formation of bottom gate cut region. FIG. 5 illustrates a cross section X of the bottom nano device of the offset stacked device, in accordance with the embodiment of the present invention. FIG. 6 illustrates a cross section $Y_2$ of the source/drain region of the offset stacked device, in accordance with the embodiment of the present invention. FIG. 7 illustrates a cross section $Y_1$ of the gate region of the offset stacked device after the formation of a plurality of bottom gate cuts 155, in accordance with the embodiment of the present invention. A plurality of bottom gate cuts 155 are formed in the dummy gate 135. The plurality of bottom gate cuts 155 are formed by creating a plurality of trenches (not shown) in the dummy gate 135 and filling the trenches with a dielectric material. The plurality of bottom gate cuts 155 are spaced throughout the dummy gate 135, such that a bottom gate cut 155 is located on each side of one of the bottom nano stacks 111, 112, as illustrated by FIG. 7.

FIGS. 8, 9 and 10 illustrate the process stage after top channel formation by wafer bonding, followed by top device formation by patterning the channel material, forming dummy gate, forming spacer/inner spacer, followed by source/drain epi growth and interlayer dielectric layer formation. FIG. 8 illustrates a cross section X of the bottom nano stack of the offset stacked device after the formation of a bonding oxide 160, a top spacer 165, a top dummy gate 170, and a top interlayer dielectric 180, in accordance with the embodiment of the present invention. A bonding oxide 160 is formed on top of the interlayer dielectric layer 145, the upper spacer 130 and the dummy gate 135. A top dummy gate 170 and a top spacer 165 are located on top of the bonding oxide 160. A top interlayer dielectric 180 is formed on top of the bonding oxide 160. The top interlayer dielectric 180 is located adjacent to the top spacer 165 as illustrated by FIG. 8.

FIG. 9 illustrates a cross section $Y_2$ of the source/drain region of the offset stacked device after the formation of a bonding oxide 160, and a plurality of upper source/drains 185, in accordance with the embodiment of the present invention. The bonding oxide 160 is formed on top of the interlayer dielectric layer 145. A plurality of upper source/drains 185 are formed on top of the bonding oxide 160. Each of the plurality of the upper source/drains 185 corresponds to one of the plurality of upper nano stacks 192, 194, 196. A top interlayer dielectric 180 is formed on top of the bonding oxide 160 and surrounds the upper source/drains 185, where the top interlayer dielectric 180 is in direct contact with multiple sides of each of the upper source/drains 185.

The plurality of upper source/drains 185 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

FIG. 10 illustrates a cross section $Y_1$ of the gate region of the offset stacked device after the formation of a bonding oxide 160, a plurality of upper source/drains 185, and a plurality of upper nano stacks 192, 194, 196, in accordance with the embodiment of the present invention. The bonding oxide 160 is formed on top of the dummy gate 135 and the gate cuts 155. A plurality of upper nano stacks 192, 194, 196 are formed on top of the bonding oxide 160. Each of the plurality of upper nano stacks 192, 194, 196 are comprised of a plurality of sacrificial layers 120, a plurality of channel layers 115 (i.e., nanosheets). Each of the plurality of upper nano stacks 192, 194, 196 is offset from one of the plurality of bottom nano stacks 111, 112. The center vertical axis (i.e., B-axis) of each of the plurality of upper nano stacks 192, 194, 196 is not vertically aligned over the center vertical axis (i.e., A-axis) of one of the bottom nano stacks 111, 112, e.g., the vertical axis is staggered from the each other. The center vertical axis (i.e., B-axis) of each of the plurality of upper nano stacks 192, 194, 196 can be aligned over one of the gate cuts 155 or over the dummy gate 135. The center vertical axis (i.e., A-axis) of each of the plurality of bottom nano stacks 111, 112, is vertically aligned with a section of the top dummy gate 170. A top dummy gate 170 is formed on top of the bonding oxide 160 and the top dummy gate 170 is in contact with three sides of each of the plurality of upper nano stacks 192, 194, 196.

FIGS. 11, 12 and 13 illustrate the process stage after forming dummy gate opening trench. FIG. 11 illustrates a cross section X of the bottom nano stack of the offset stacked device after the formation of a first trench 205, in accordance with the embodiment of the present invention. The top dummy gate 170 and a portion of the bonding oxide 160 is removed to create the first trench 205. The first trench 205 extends through the bonding oxide 160 to expose a surface of the dummy gate 135 and the first trench 205 divide the bonding oxide 160 into multiple separate sections.

FIG. 12 illustrates a cross section $Y_2$ of the source/drain region of the offset stacked device after the formation of a first trench 205, in accordance with the embodiment of the present invention. FIG. 13 illustrates a cross section $Y_1$ of the gate region of the offset stacked device after the formation of a first trench 205 and a second trench 210, in accordance with the embodiment of the present invention. A portion of the top dummy gate 170 and a portion of the bonding oxide 160 is removed to create the first trench 205 and the second trench 210. The first trench 205 is located between the first upper nano stack 192 and the second upper nano stack 194. The second trench 210 is located between the second upper nano stack 194 and the third upper nano stack 196. The first trench 205 extends through the bonding oxide 160 to expose a surface of the dummy gate 135. The first trench 205 is vertically aligned with a portion of the first bottom nano stack 111 and the second trench 210 is vertically with a portion of the second bottom nano stack 112. The second trench 210 extends through the bonding oxide 160 to expose a surface of the dummy gate 135. The first trench 205 and the second trench 210 create an opening through the bonding oxide 160. The first trench 205 and the second trench 210 create gaps in the bonding oxide 160, thus dividing the bonding oxide 160 into multiple sections.

FIGS. 14, 15 and 16 illustrate the process stage after removing dummy gate and sacrificial layers. FIG. 14 illustrates a cross section X of the bottom nano stack of the offset stacked device after the removal of the dummy gate 135 and the sacrificial layers 120, in accordance with the embodiment of the present invention. FIG. 15 illustrates a cross section $Y_2$ of the source/drain region of the offset stacked device after the removal of the dummy gate and the sacrificial layers, in accordance with the embodiment of the present invention. An empty space is created by the removal of the dummy gate 135 and the sacrificial layer 120.

FIG. 16 illustrates a cross section $Y_1$ of the gate region of the offset stacked device after the removal of the top dummy gate 170, the dummy gate 135, and the sacrificial layers 120, in accordance with the embodiment of the present invention. The top dummy gate 170, the dummy gate 135, and the sacrificial layer 120 are selectively removed. The empty space located around each of the bottom nano stacks 111, 112, is connected to the empty space located around the upper nano stacks 192, 194, 196 though the gaps in the bonding oxide 160.

Figure 17:
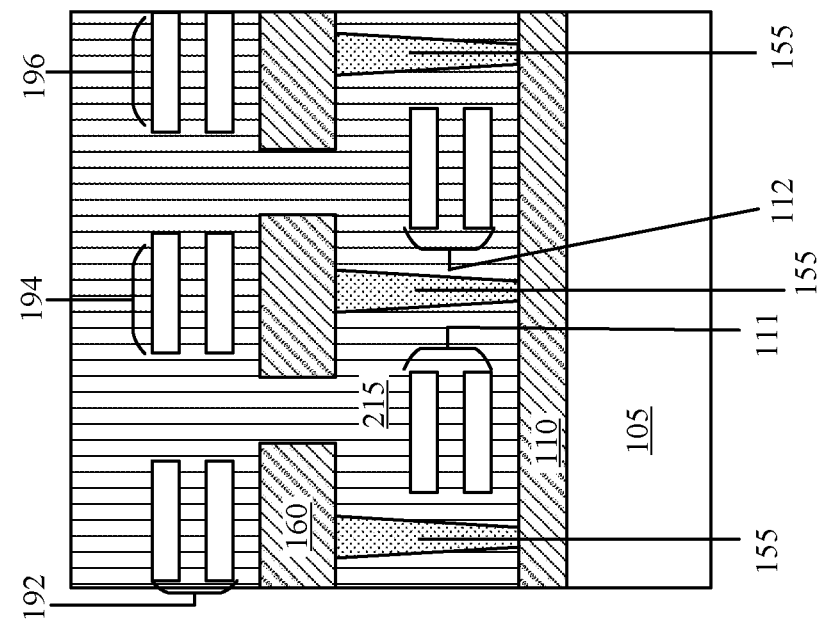
FIG. 17 illustrates a cross section X of the bottom nano stack of the offset stacked device after the formation of a gate, in accordance with the embodiment of the present invention.
Figure 18:
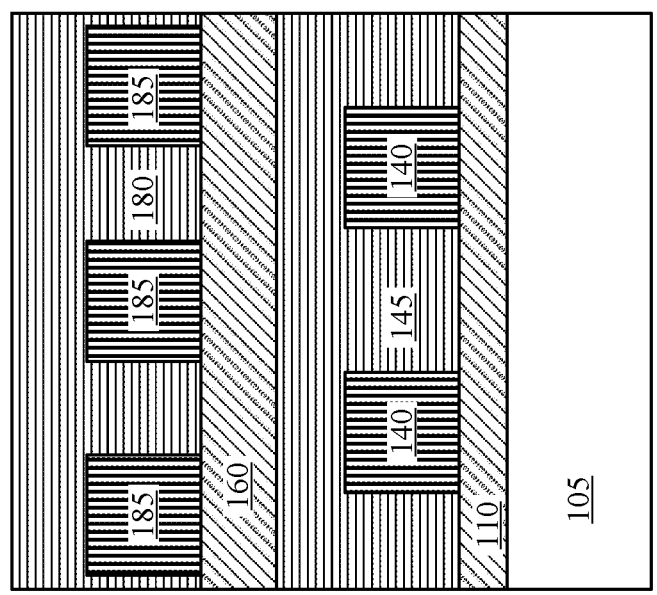
FIG. 18 illustrates a cross section $Y_2$ of the source/drain region of the offset stacked device after formation of a gate, in accordance with the embodiment of the present invention.
Figure 19:
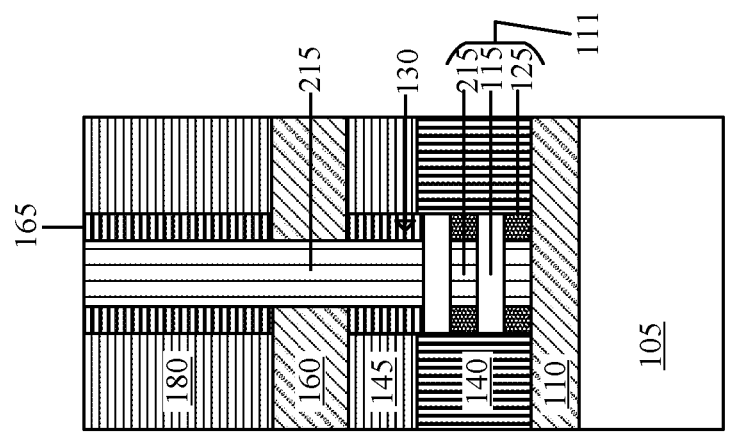
FIG. 19 illustrates a cross section $Y_1$ of the gate region of the offset stacked device after formation of a gate, in accordance with the embodiment of the present invention.

FIGS. 17, 18, and 19 illustrate the process stage after replacement gate formation. FIG. 17 illustrates a cross section X of the bottom nano stack of the offset stacked device after the formation of a gate 215, in accordance with the embodiment of the present invention. FIG. 18 illustrates a cross section $Y_2$ of the source/drain region of the offset stacked device after formation of a gate 215, in accordance with the embodiment of the present invention. A gate 215 is formed by filling the empty space created by the removal of the layers in the previous steps with a gate material. The gate 215 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W. The gate 215 extends downwards from a top surface of the top interlayer dielectric 180 to a top surface of the oxide layer 110. The gate 215 surrounds each of the channel layers 115 of the first bottom nano stack 111.

FIG. 19 illustrates a cross section $Y_1$ of the gate region of the offset stacked device after formation of a gate 215, in accordance with the embodiment of the present invention. A gate 215 is formed by filling the empty space created by the removal of the layers in the previous steps with a gate material. The gate 215 surrounds each of the plurality of bottom nano stacks 111, 112, and each of the plurality of upper nano stacks 192, 194, 196. The gate 215 is continuous between the plurality of bottom nano stacks 111, 112, and the plurality of upper nano stacks 192, 194, 196. The gate 215 is located between sections of the bonding oxide 160. For example, the gate 215 is continuous between the bottom nano stack 111 and the upper nano stacks 192, 194, 196, since at this stage there are no gate cuts separating the upper nano stacks 192, 194, 196.

FIGS. 20, 21 and 22 illustrate the process stage after forming a shared upper gate cut. FIG. 20 illustrates a cross section X of the bottom nano stack of the offset stacked device after the formation of a shared upper gate cut 220 in accordance with the embodiment of the present invention. FIG. 21 illustrates a cross section $Y_2$ of the source/drain region of the offset stacked device after formation of a shared upper gate cut 220, in accordance with the embodiment of the present invention. FIG. 22 illustrates a cross section $Y_1$ of the gate region of the offset stacked device after formation of a shared upper gate cut 220, in accordance with the embodiment of the present invention. A trench (not shown) is formed in the gate 215 at a location where a shared gate device will be located. The trench is filled with a dielectric material to form a shared upper gate cut 220. As illustrated by FIG. 22, the shared upper gate cut 220 extends downwards, such that a bottom section of the shared upper gate cut 220 is directly adjacent to a section of the bonding oxide 160. This means that the bottom section of the shared upper gate cut 220 is in direct contact with the bonding oxide 160. As emphasized by the dashed circle 221, the middle section of the shared upper gate cut 220 is space a distance from the closes channel layers 115 of the second upper nano stack 194. The gate 215 is located between the channel layers 115 of the second upper nano stack 194 and the shared upper gate cut 220. As illustrated by dashed circle 222, the shared upper gate cut 220 is positioned such that the gate 215 is still continuous between the second bottom nano stack 112 and the third upper nano stack 196.

FIGS. 23, 24 and 25 illustrate a process stage after formation of an independent gate trench and an isolation liner. FIG. 23 illustrates a cross section X of the bottom nano stack of the offset stacked device after the formation of an independent gate trench 225 and an isolation liner 230, in accordance with the embodiment of the present invention. An independent gate trench 225 is formed by removing a portion of the gate 215 and a portion from adjacent sections of the bonding oxide 160. The independent gate trench 225 extends into the sections of the bonding oxide 160 but does not extend all the way through the sections of the bonding oxide 160. An isolation liner 230 is formed on the exposed surfaces and etch back so that the isolation liner 230 remains on the sidewalls of the independent gate trench 225. A top surface of the gate 215 remains exposed by the bottom of the independent gate trench 225 after the formation of the isolation liner 230.

FIG. 24 illustrates a cross section $Y_2$ of the source/drain region of the offset stacked device after formation of an independent gate trench 225 and an isolation liner 230, in accordance with the embodiment of the present invention. FIG. 25 illustrates a cross section $Y_1$ of the gate region of the offset stacked device after formation of an independent gate trench 225 and an isolation liner 230, in accordance with the embodiment of the present invention. An independent gate trench 225 is formed by removing a portion of the gate 215 and a portion from adjacent sections of the bonding oxide 160. The independent gate trench 225 extends into the sections of the bonding oxide 160 but does not extend all the way through the sections of the bonding oxide 160. An isolation liner 230 is formed on the exposed surfaces and etch back so that the isolation liner 230 remains on the sidewalls of the independent gate trench 225. As illustrated by dashed circle 231, the isolation liner 230 is in direct contact with the sidewalls of the channel layers 115 of the first upper nano stack 192. Furthermore, the isolation liner 230 is in direct contact with the channel layers 115 of the second upper nano stack 194. The isolation liner 230 acts as a gate cut between the adjacent upper nano stacks 192, 194. The isolation liner 230 further acts as a gate cut for the first bottom nano stack 111. As illustrated by dashed circle 232, the second upper nano stack 194 is isolated by being located between the isolation liner 230 and the shared upper gate cut 220. Therefore, the second upper nano stack 194 is an independent device with an independent gate 215. Furthermore, the channel layer 115 of the second upper nano stack 194 have one side in direct contact with the isolation liner 230 and one side located a distance from the shared upper gate cut 220.

FIGS. 26, 27 and 28 illustrate a process stage after the filling of the independent gate trench 225 with additional gate metal. FIG. 26 illustrates a cross section X of the bottom nano stack of the offset stacked device after the filling of the independent gate trench 225 with additional gate metal, in accordance with the embodiment of the present invention. FIG. 27 illustrates a cross section $Y_2$ of the source/drain region of the offset stacked device after the filling of the independent gate trench 225 with additional gate metal, in accordance with the embodiment of the present invention. FIG. 28 illustrates a cross section $Y_1$ of the gate region of the offset stacked device after the filling of the independent gate trench 225 with additional gate metal, in accordance with the embodiment of the present invention. The independent gate trench 225 is filled with additional gate metal, thus extending the gate 215 to the top of the isolation liner 230. As illustrated by FIG. 28, dashed circle 240 emphasizes that gate 215 is a shared gate, such that, the gate 215 is continuous between the second bottom nano stack 112 (i.e., a lower transistor) and the third upper nano stack 196 (i.e., an upper transistor). Dashed square 242 emphasizes an independent gate upper device, meaning that the gate 215 located around the second upper nano stack 194 is isolated from the surrounding gate material. Dashed square 244 emphasizes an independent gate bottom device, meaning that the gate 215 located around the first bottom nano stack 111 is isolated from the surrounding gate material by the gate cut 155 and the isolation liner 230. The gate 215 around first nano stack 111 is in direct contact with two lower gate cuts 155 and with two sections of the isolation liner 230.

Figure 29:
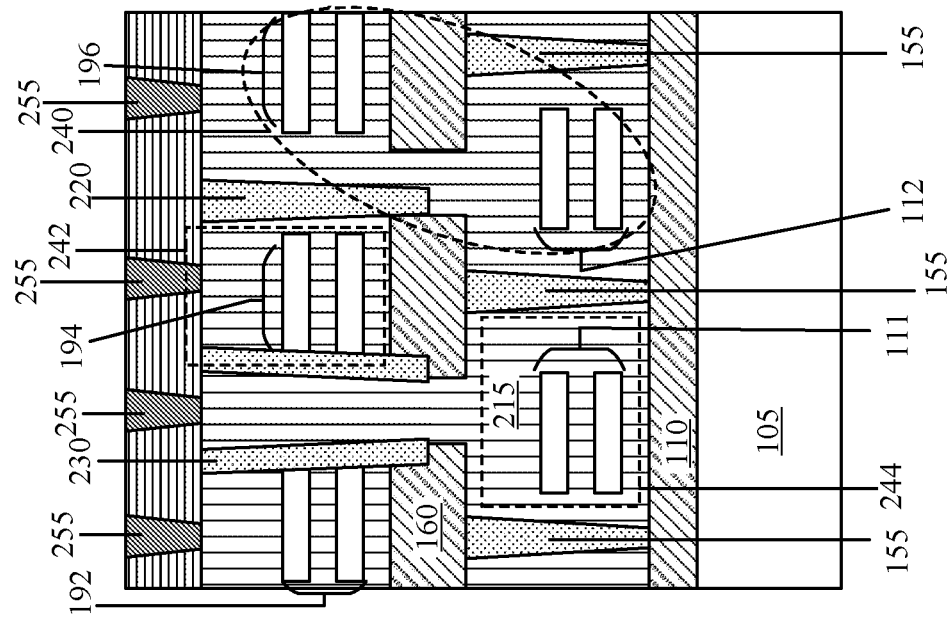
FIG. 29 illustrates a cross section X of the bottom nano stack of the offset stacked device after the formation of gate contacts and source/drain contacts, in accordance with the embodiment of the present invention.
Figure 30:
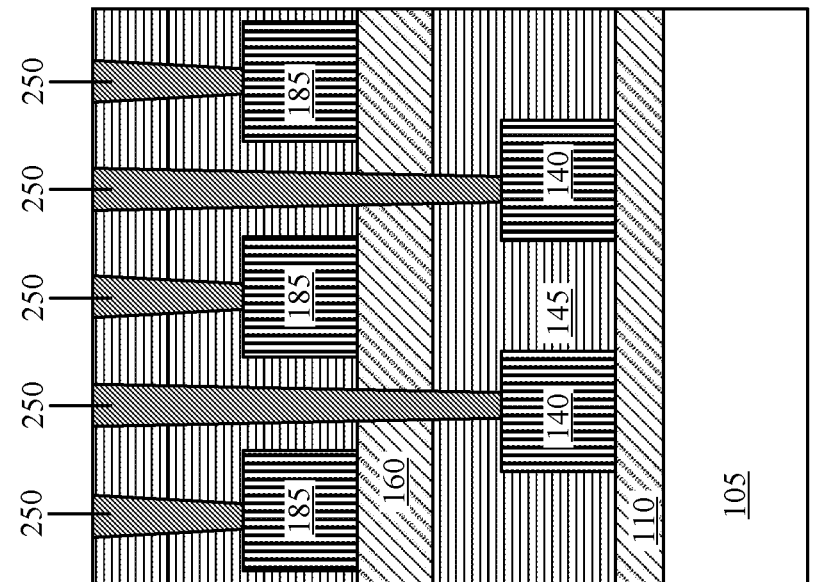
FIG. 30 illustrates a cross section $Y_2$ of the source/drain region of the offset stacked device after the formation of gate contacts and source/drain contacts, in accordance with the embodiment of the present invention.
Figure 31:
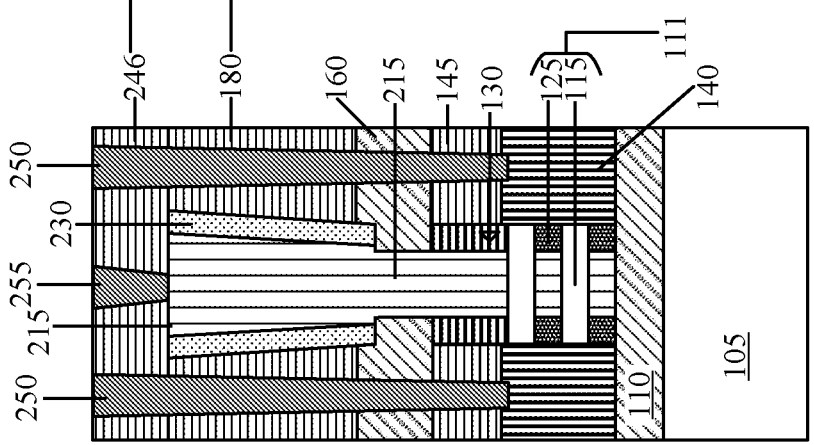
FIG. 31 illustrates a cross section $Y_1$ of the gate region of the offset stacked device after the formation of gate contacts and source/drain contacts, in accordance with the embodiment of the present invention.

FIGS. 29, 30, and 31 illustrate a process stage after formation of gate contacts 255 and source/drain contacts 250. FIG. 29 illustrates a cross section X of the bottom nano stack of the offset stacked device after the formation of gate contacts 255 and source/drain contacts 250, in accordance with the embodiment of the present invention. FIG. 30 illustrates a cross section $Y_2$ of the source/drain region of the offset stacked device after the formation of gate contacts 255 and source/drain contacts 250, in accordance with the embodiment of the present invention. FIG. 31 illustrates a cross section $Y_1$ of the gate region of the offset stacked device after the formation of gate contacts 255 and source/drain contacts 250, in accordance with the embodiment of the present invention.

A second upper interlayer dielectric 246 is formed on top of the top interlayer dielectric 180, the isolation liner 230, and the gate 215. Trenches (not shown) are formed in the second upper interlayer dielectric 246 and filled with a conductive material to form gate contacts 255. As illustrated by FIG. 29, trenches (not shown) are formed in the second upper interlayer dielectric 246, the top interlayer dielectric 180, the bonding oxide 160, and the interlayer dielectric layer 145 and filled with a conductive material to form source/drain contacts 250. As illustrated by FIG. 30, trenches (not shown) are formed in the second upper interlayer dielectric 246, the top interlayer dielectric 180, and filled with a conductive material to form source/drain contacts 250.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic structure comprising:
a plurality of lower transistors and a plurality of upper transistor, wherein each of the plurality of lower transistors and the plurality of upper transistors includes a plurality of channels, wherein an upper center vertical axis of each of the plurality of upper transistors is staggered from a lower center vertical axis of each of the lower transistors;

a lower gate cut is located between each of the plurality of lower transistors; and a first upper gate cut located adjacent to a first upper transistor of the plurality of upper transistors, wherein the first upper gate cut is in direct contact with a plurality of first channels of the first upper transistor.

2. The microelectronic structure of claim 1, wherein each of the plurality of upper transistor is vertically aligned with one of the lower gate cuts.

3. The microelectronic structure of claim 2, further comprising:

a bonding oxide layer section located on top of each of the lower gate cuts, wherein the each of the plurality of upper transistor is located on top of the bonding oxide layer section.

4. The microelectronic structure of claim 3, further comprising:

a gate surrounds the plurality of channels of each of the plurality of lower transistors, wherein the gate surrounds the plurality of channels of each of the plurality of upper transistors.

5. The microelectronic structure of claim 4, further comprising:

a second upper gate cut located adjacent to a second upper transistor of the plurality of upper transistors, wherein the second upper gate cut is in direct contact with the plurality of channels of the second upper transistor.

6. The microelectronic structure of claim 5, wherein the gate surrounding a first lower transistor of the plurality of the lower transistors extends vertically between the first upper gate cut and the second upper gate cut.

7. The microelectronic structure of claim 6, wherein the gate is direct contact with the lower gate cut that is located on each side of the lower transistor, wherein the gate is in direct contact with the first upper gate cut and the second upper gate cut.

8. The microelectronic structure of claim 7, wherein the gate surrounding the first lower transistor is isolated from the plurality of lower transistor, and wherein the gate surrounding the first lower transistor is isolated from the plurality of upper transistors.

9. A microelectronic structure comprising:

a plurality of lower transistors and a plurality of upper transistor, wherein each of the plurality of lower transistors and the plurality of upper transistors includes a plurality of channels, wherein an upper center vertical axis of each of the plurality of upper transistors is staggered from a lower center vertical axis of each of the lower transistors;

a lower gate cut is located between each of the plurality of lower transistors;

a first upper gate cut located adjacent to a first side of a first upper transistor of the plurality of upper transistors, wherein the first upper gate cut is in direct contact with a plurality of first channels of the first upper transistor; and a second upper gate cut located adjacent a second side of the first upper transistor, wherein the second upper gate cut is spaced a distance from the plurality of first channels of the first upper transistor.

10. The microelectronic structure of claim 9, wherein each of the plurality of upper transistor is vertically aligned with one of the lower gate cuts.

11. The microelectronic structure of claim 10, further comprising:

a bonding oxide layer section located on top of each of the lower gate cuts, wherein the each of the plurality of upper transistor is located on top of the bonding oxide layer section.

12. The microelectronic structure of claim 11, further comprising:

a gate surrounds the plurality of channels of each of the plurality of lower transistors, wherein the gate surrounds the plurality of channels of each of the plurality of upper transistors.

13. The microelectronic structure of claim 12, wherein the gate is located between the plurality of channels of the first transistor and the second upper gate cut.

14. The microelectronic structure of claim 13, wherein the first upper gate cut and the second upper gate cut isolates the gate surrounding the first upper transistor from the other plurality of lower transistor, and wherein the first upper gate cut and the second upper gate cut isolates the gate surrounding the first upper transistor from the plurality of upper transistors.

15. The microelectronic structure of claim 12, further comprising:

a third upper gate cut located adjacent to a second upper transistor of the plurality of upper transistors, wherein the third upper gate cut is in direct contact with the plurality of channels of the second upper transistor.

16. The microelectronic structure of claim 15, wherein the gate surrounding a first lower transistor of the plurality of the lower transistor extends vertically between the first upper gate cut and the third upper gate cut.

17. The microelectronic structure of claim 16, wherein the gate is direct contact with the lower gate cut that is located on each side of the lower transistor, wherein the gate is in direct contact with the first upper gate cut and the second upper gate cut.

18. The microelectronic structure of claim 17, wherein the gate surrounding the first lower transistor is isolated from the other plurality of lower transistor, and where the gate surrounding the first lower transistor is isolated from plurality of upper transistors.

19. A microelectronic structure comprising:

a plurality of lower transistors and a plurality of upper transistor, wherein each of the plurality of lower transistors and the plurality of upper transistors includes a plurality of channels, wherein an upper center vertical axis of each of the plurality of upper transistors is staggered from a lower center vertical axis of each of the lower transistors;

a lower gate cut is located between each of the plurality of lower transistors;

a first upper gate cut located adjacent to a first side of a first upper transistor of the plurality of upper transistors, wherein the first upper gate cut is spaced a distance from the plurality of first channels of the first upper transistor; and a gate surrounds the plurality of channels of a second upper transistor of the plurality of upper transistors, wherein the second upper transistor is adjacent to the first upper transistor, wherein the gate surrounds the plurality of channels of a first lower transistor of the plurality of lower transistors, wherein the gate is continuous between the second upper transistor and the first lower transistor.

20. The microelectronic structure of claim 19, further comprising a second upper gate cute located adjacent to a second side of a first upper transistor of the plurality of upper transistors, wherein the second upper gate cut is in direct contact with the plurality of channels of the first upper transistor.

\* \* \* \* \*